US006878448B2

(12) United States Patent
Ishii et al.

(10) Patent No.: US 6,878,448 B2
(45) Date of Patent: Apr. 12, 2005

(54) EPOXY RESIN COMPOSITION FOR SEMICONDUCTOR ENCAPSULATION AND SEMICONDUCTOR DEVICE USING THE SAME

(75) Inventors: Toshiaki Ishii, Hitachi (JP); Hiroyoshi Kokaku, Hitachi (JP); Akira Nagai, Hitachi (JP); Takao Miwa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/961,746

(22) Filed: Sep. 25, 2001

(65) Prior Publication Data

US 2002/0146565 A1 Oct. 10, 2002

(30) Foreign Application Priority Data

Jan. 19, 2001 (JP) ....................................... 2001-010982

(51) Int. Cl.$^7$ ......................... B32B 27/38; H01L 21/56; C08L 63/00

(52) U.S. Cl. ....................... 428/413; 438/127; 523/400; 523/457; 528/87; 528/88; 528/219

(58) Field of Search ................................. 428/413, 414; 438/106, 127; 523/400, 457; 528/87, 88, 219

(56) References Cited

U.S. PATENT DOCUMENTS

| | | | | | |
|---|---|---|---|---|---|
| 4,042,550 A | * | 8/1977 | Tuller et al. | ................ | 523/434 |
| 5,453,453 A | * | 9/1995 | Lamon et al. | ................ | 521/54 |
| 6,248,454 B1 | * | 6/2001 | Ikemura | ..................... | 428/620 |

FOREIGN PATENT DOCUMENTS

| | | |
|---|---|---|
| JP | 58-80340 | 5/1983 |
| JP | 58-174434 | 10/1983 |

* cited by examiner

*Primary Examiner*—Philip Tucker
*Assistant Examiner*—Michael J Feely
(74) *Attorney, Agent, or Firm*—Dickstein Shapiro Morin & Oshinsky, LLP

(57) ABSTRACT

The present invention provides a biphenyl based epoxy resin comprising a curing agent and an inorganic filler containing an alkali alkaline earth metal oxide wherein the epoxy resin has a variation rate of hardness at 25° C. and a relative humidity of 50% for 72 hours of less than 10% and a variation rate of flow at 25° C. and a relative humidity of 20% or below for 72 hours of less than 20%.

46 Claims, 3 Drawing Sheets

EPOXY RESIN COMPOSITION FOR SEMICONDUCTOR ENCAPSULATION AND SEMICONDUCTOR DEVICE USING THE SAME

FIELD OF THE INVENTION

This invention relates to an encapsulating material for semiconductor devices, a semiconductor device using the same, and to a method of fabricating the encapsulating material.

DISCUSSION OF THE RELATED ART

Typically, as a resin for semiconductor encapsulation, epoxy resin is used as a resin component, a phenolic resin as a curing agent and an inorganic filler is further formulated therein. This resin has good properties such as moldability, mechanical characteristics and bonding properties and are excellent in mass productivity and reliability.

The resin composition for semiconductor encapsulation usually makes use of an epoxy resin compound having two or more glycidyl ether groups in the molecule and a phenolic resin curing agent having a hydroxyl group in the molecule. In the encapsulation process of a semiconductor device, the epoxy resin and the phenolic resin curing agent undergo a reaction between the glycidyl ether group and the hydroxyl group in the presence of an appropriate curing catalyst, thereby providing a cured product. The reaction velocity, i.e. a time before the cured product is removed from a mold, depends on the type and amount of catalyst.

The phenolic resin curing agent formulated in the resin composition for semiconductor encapsulation has a hydroxyl group in the molecule and has easy moisture absorption. If the phenolic resin curing agent has absorbed moisture therein, the curing reaction with the epoxy resin becomes slow, with the attendant problem that a finally obtained cured product has low hardness, thus lowering mass productivity of the semiconductor device.

To this end, an ortho-cresol novolac-type epoxy resin has been conventionally employed in an epoxy resin composition for semiconductor encapsulation to avoid the problems with moisture absorption. However, as the size of a silicon chip increases with an increasing degree of integration of a semiconductor, an encapsulation resin layer is required to be as thin as possible. But, when the encapsulation layer is made thin, cracks are liable to occur owing to thermal stress between the silicon chip and the encapsulation resin layer. To avoid this, it becomes necessary to suppress thermal expansion. To this end, there has been frequently used an epoxy resin, which is lower in viscosity and thermal expansion than the conventional ortho-cresol novolac-type epoxy resin and permits a silica filler to be formulated in larger amounts.

Hence, a biphenyl-type epoxy resin has been widely employed because of its improved physical characteristics. But, as mentioned above, a biphenyl type epoxy resin suffers from possible moisture absorption. When a resin composition comprising this type of biphenyl-type epoxy resin absorbs moisture in the course of storage, there arises the problem that curing is impeded upon molding, mass productivity lowers due to the increase in curing time, and a heat resistance of the molding obtained after curing is decreased. Further, care must be exercised in maintaining a low humidity at a manufacturing site and avoiding the influence of moisture absorption on storage and transport, thus, increasing costs.

Conventionally, in order to mitigate the influence of the curing impedance or trouble caused by the moisture absorption, a curing promoter for an epoxy resin is increased in amount. In this case, however, the curing reaction gradually proceeds during the course of storage of the resin composition, and the viscosity increases causing failures, such as non-packing, bending of a gold wire and wire breakage to take place during semiconductor encapsulation. Further, the increased amount of the curing promoter causes problems with reliability in moistureproofing and heat resistance at electric junctions within a semiconductor device.

SUMMARY OF THE INVENTION

The present invention provides an epoxy resin composition for semiconductor encapsulation, which is moisture resistant and overcomes the above-stated problems.

In order to achieve the above objects, an alkaline earth metal oxide, preferably calcium oxide, is used in biphenyl-type epoxy resin used as an epoxy resin for semiconductor encapsulation. The epoxy resin for semiconductor encapsulation of the invention, to which a curing promoter is added, should contain, at least, an epoxy resin of the type represented by (Chemical Formula 1, shown below) as an essential component, and should have a variation rate of hardness at 25° C. and a relative humidity of 50% for 72 hours of less than 10% and a variation rate of flow length at 25° C. and a relative humidity of 20% or below for 72 hours of less than 20%.

In the epoxy resin composition containing, at least, the epoxy resin represented by (Chemical Formula 1), the composition is formulated with an additive which is able to absorb moisture in the epoxy resin composition when the epoxy resin composition is subjected to a curing reaction and is able to release the absorbed moisture when the epoxy resin composition is heated, exhibiting a flame-retardant effect.

Such an additive is made of calcium oxide, and the curing agent is made of a phenolic resin, with the amount of the phenolic resin being such that the equivalent ratio of the hydroxyl group of the phenolic resin to epoxy group of the epoxy resin ranges from 1.3 to 1.5. The calcium oxide is formulated in an amount of 0.5 wt % to 50 wt % relative to the curing agent. Silica is formulated as part of the inorganic filler in an amount at least 78 vol %, and calcium metaborate may be formulated therein.

In yet another object of the invention, at least a part of a semiconductor is encapsulated with the epoxy resin composition as described above.

In this way, the resin layer for encapsulation of a semiconductor device with a high degree of integration can be rendered thin, and a resin composition for semiconductor encapsulation capable of preventing moisture absorption can be obtained. Further, this not only achieves mass production of a highly integrated semiconductor device, but also can realize a resin composition for semiconductor encapsulation having excellent curability and moldability and a semiconductor device using the composition.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

Figure 1:
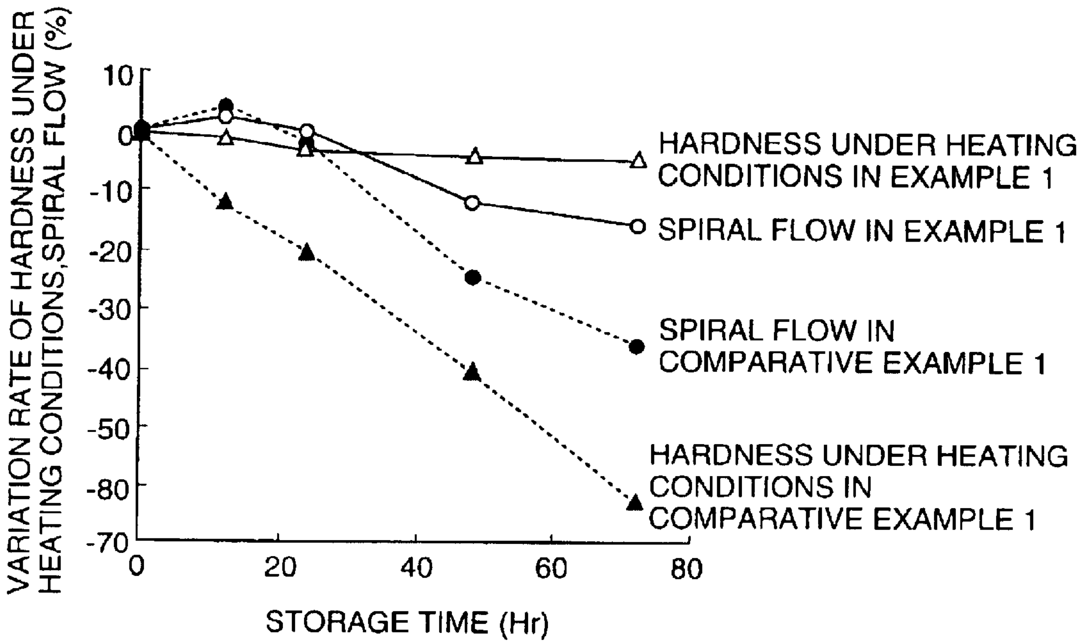
FIG. 1 is a graph showing a variation rate prior to and after storage under conditions of 25° C. and a relative humidity of 50% and 25° C. and a relative humidity of 20% or below with respect to a hardness value under heating conditions and a spiral flow length value of epoxy resin compositions in Example 1 of the invention and Comparative Example 1 in relation to the storage time.

Exemplary embodiment of the present invention will be described below in connection with the drawings. Other embodiments may be utilized and structural or logical changes may be made without departing from the spirit or scope of the present invention. Like items are referred to by like reference numerals throughout the drawings.

An additive used in the invention is characterized in that it is able to absorb moisture in an epoxy resin when the resin is subjected to a curing reaction, and can stably be present in the epoxy resin after curing and that when a cured product is burned, the moisture absorbed upon the curing is released, thereby exhibiting flame retardancy ascribed to the cooling effect mainly caused by the moisture.

More particularly, alkaline earth metal oxides are suitable and include calcium oxide, barium oxide, magnesium oxide, beryllium oxide and strontium oxide. These form hydroxides when subjected to reaction with moisture at the time of thecuring reaction. The hydroxide stably exists in the resultant cured product, and the moisture is released under high temperature conditions where the cured product is burned. Of the alkali alkaline earth metal oxides used in the invention, calcium oxide is preferred in view of moisture absorption and stability in the cured product.

Calcium oxide used in the present invention should preferably be in the form of powder. More preferably, an average particle size ranges from approximately 0.1 μm to 100 μm. If the average particle size is smaller than 0.1 μm, the resultant epoxy resin composition becomes highly thixotropic and increases in viscosity, making it difficult to mold the composition. On the other hand, when the average particle size exceeds 100 μm, packing of a material in a narrow portion of a material flow passage in a mold is disenabled, or a resin component and a filler are liable to separate from each other, so that moldings cannot be stably obtained. This is because when the average particle size exceeds 100 μm, an adding effect of calcium oxide becomes extremely small. The manner of powdering is not critical and may be effected by any of known procedures.

The amount of the alkaline earth metal oxide used in the invention should preferably range from 0.5 wt % to 50 wt % based on the curing agent in the epoxy resin composition. This is because if the amount is 0.5 wt % or less, a significant effect on the curing reaction of the epoxy resin is not expected and when the amount exceeds 50 wt %, there is a problem with increased viscosity. The amount of calcium oxide based entirely on the epoxy resin composition differs depending on the specific gravity and amount of an inorganic filler used in combination. In order to prevent the curing reaction from being impeded with the moisture contained in the inorganic filler or existing as condensed water, it is preferred to formulate the calcium oxide in an amount of from 0.05 wt % to 5 wt % relative to the epoxy resin composition as a whole. If the amount is less than 0.05 wt %, the effect is not significant, and when the amount exceeds 5 wt %, a problem of increasing viscosity is involved.

In the epoxy resin composition for semiconductor encapsulation of the invention, a greater effect of the invention is obtained when using a biphenyl-type epoxy resin having a lower degree of curability upon absorption of moisture. Other types of epoxy resins are not critically limited, and the improving effect is attained when using such a type of epoxy resin that ensures the lowering of moisture absorption through combination with a curing agent and other filler. These epoxy resins may be ones ordinarily employed for semiconductor encapsulation. For instance, phenol novolac-type epoxy resins, cresol novolac-type epoxy resins, bisphenols-based epoxy resins such as bisphenol A, bisphenol F and bisphenol S-type epoxy resins, phenol or cresol-based polyfunctional epoxy resins having three or greater functionalities, epoxy resins having a biphenyl group, a naphthalene group and a dicyclopentadiene group and two or more glycidyl ether groups.

In the practice of the invention, the curing agent is preferably made of a phenolic compound having one or more phenolic hydroxyl groups per molecule. More preferably, a compound having two or more phenolic hydroxyl groups is used. For instance, phenolic novolac resins, polycondensates of phenols and aralkyl ethers, bisphenol resins, ortho-cresol novolac resins and poly-paravinyl phenols. The curing promoters may be known ones including amines such as 1,8-diazabicyclo(5,4,0) undecene-7, imidazoles such as 2-methylimidazole, phosphorus compounds such as triphenylphosphine and derivatives thereof.

In the practice of the invention, fillers, plasticizers, coupling agents, lubricants, colorants and the like may be further formulated, if necessary in order to improve characteristic properties such as toughness, a low modulus of elasticity, adhesiveness and releasing properties. Usable fillers include inorganic and organic filling materials. Of these, fine powders of fused silica, crystalline silica, alumina, calcium carbonate, calcium silicate, talc, clay, mica and the like are preferred to balance moldability, a coefficient of thermal expansion, electric characteristics and mechanical strength. The particle size of a filler preferably ranges from 0.1 μm to 30 μm, more preferably from 0.5 μm to 10 μm. If the average particle size is less than 0.1 μm, the resultant epoxy resin composition very thixotropic and the viscosity increases making molding difficult. When the particle size exceeds 30 μm, packing of a material to a narrow portion of a material flow passage within a mold is disenabled and the resin component and the filler are apt to separate from each other, so that stable moldings cannot be obtained.

With respect to the plasticizers, coupling agents, lubricants, colorants and adhesion imparting agent, any known ones may be used. These components are formulated, mixed, broken into pieces and, if necessary, granulated to obtain an epoxy resin composition of the invention. Kneading is usually effected by use of hot rolls, an extruder or the like. The semiconductor device of the invention is obtained by encapsulation using the thus obtained epoxy resin composition. The manufacturing method is effected in a usual manner. In general, low-pressure transfer molding is used. In some cases, compression molding, injection molding and the like methods may be used. In order to improve reliability of the semiconductor device, it is preferred to carry out a thermal treatment at a temperature of 150° C. or over for a given time after molding with the epoxy resin composition so as to obtain satisfactory curing.

The epoxy resin composition of the invention exhibits good curability and when the composition is used for encapsulation of a semiconductor, mass productivity is improved. In the practice of the invention, an amount of a curing catalyst that adversely influences long-time reliabilities such as a heat resistance and moistureproofness can be reduced with the resultant cured product having a high heat resistance, thereby providing a semiconductor device with excellent reliability.

The effect of the alkaline earth metal oxide used in the invention resides in the reduction of a curing problems ascribed to moisture in the epoxy resin composition in the course of the curing reaction of the epoxy resin composition. As is well known in the art, an alkaline earth metal oxide reacts with water to provide a hydroxide. In the epoxy resin composition of the invention, an alkaline earth metal oxide undergoes a similar change to exhibit its effect on the curing reaction of the epoxy resin composition. When heated to a temperature of 100° C. or over upon molding, the moisture in flit epoxy resin composition remains in the composition because of the pressurization thereof, thereby causing a curing problems. When cured, the alkaline earth metal oxide absorbs moisture to change the oxide to a hydroxide, resulting in the promotion of the curing reaction. The oxide stably exists in the course of a subsequent curing treatment and storage of the epoxy resin composition. With calcium oxide, it gradually changes to more stable calcium carbonate. The hydroxide formed during the curing is able to release water when the epoxy resin composition is burnt and becomes high in temperature, permitting the composition to be flame-retardant. This contributes to the reduction in amount of organic flame retardants such as brominated epoxy resins and phosphorus compounds, inorganic flame retardants such as antimony oxide, which have been formulated in the epoxy resin composition for semiconductor encapsulation previously. These flame retardants are able to reduce a high-temperature standing characteristic and moistureproofness of a semiconductor device, and thus, a highly reliable semiconductor device can be obtained by the reduction in amount of the flame retardant.

In the prior art, it has been conventional to increase the amount of a curing catalyst so as to improve curability in case where moisture is absorbed. Especially, in the field of a semiconductor device, usual practice has been to increase an amount of a curing catalyst as set out above. In this method, where an epoxy resin molding material for semiconductor encapsulation is stored in a dried condition at room temperature, the curing reaction of the epoxy resin gradually proceeds to make the epoxy resin higher in molecular weight, with the attendant problem of the so-called life that as the viscosity increases upon molding, given fluidity cannot be obtained.

The curability is improved through absorption of moisture upon curing as described hereinabove in the method of the invention using an alkaline earth metal oxide, it is not necessary to increase an amount of a curing catalyst but the reduction in amount may be possible. The alkaline earth metal oxide per se does not take part in the curing reaction of an epoxy resin, so that it does not influence the curing reaction in a dried condition at room temperature. Thus, two effects of improving curability in a moisture-absorbed state and improving the life can be expected. More particularly, where an epoxy resin molding material is stored under conditions of 25° C. and a relative humidity of 50% for 72 hours, a lowering rate prior to and after the storage can be suppressed to a level less than 10% with respect to the Barcol hardness or the Shore D hardness or the like obtained immediately after molding. At the same time, where the material is molded after storage under dried conditions of 25° C. and a relative humidity of 20% or below for 72 hours, a lowering rate of flow length prior to and after the storage can be less than 20% in a flaw length test such as spiral flow.

FIG. 1 is a graph showing variation rates of a hardness under heating conditions and a flow length determined by spiral flow in Example 1 using an epoxy resin composition for semiconductor encapsulation of the invention and Comparative Example 1, prior to and after storage under conditions of 25° C. and a relative humidity of 50% and dried conditions of 25° C. and a relative humidity of 20% or below, which are plotted against a storage time.

The variation in the Barcol hardness immediately after molding when the epoxy resin composition for semiconductor encapsulation of Example 1 of the invention was stored under conditions of 25° C. and a relative humidity of 50%, and a variation of the flow length in case where the composition was stored under dried conditions of 25° C. and a relative humidity of 20% or below are shown, respectively. For comparison, the results of an epoxy molding material for semiconductor encapsulation of Comparative Example 1 of the invention are also shown. When using an alkaline earth metal oxide as in the invention, the hardness under heating conditions and the flow length can be suppressed from lowering.

Although drying agents such as silica gel and magnesium sulfate are considered to exhibit a similar moisture-absorbing effect, these drying agents physically adsorb moisture thereon, so that they absorb a large amount of moisture prior to curing and then desorb once absorbed moisture at a temperature of the curing reaction of an epoxy resin, thus bringing about a contrary effect. In addition, these are present as a drying agent after completion of the curing reaction, so that the resultant cured product absorbs moisture in an amount larger than a non-formulated product. This leads to dehydration at the time of re-flowing a solder of a semiconductor device, thereby causing cracks or lowering the reliability in moistureproofness of electric characteristics.

Figure 2:
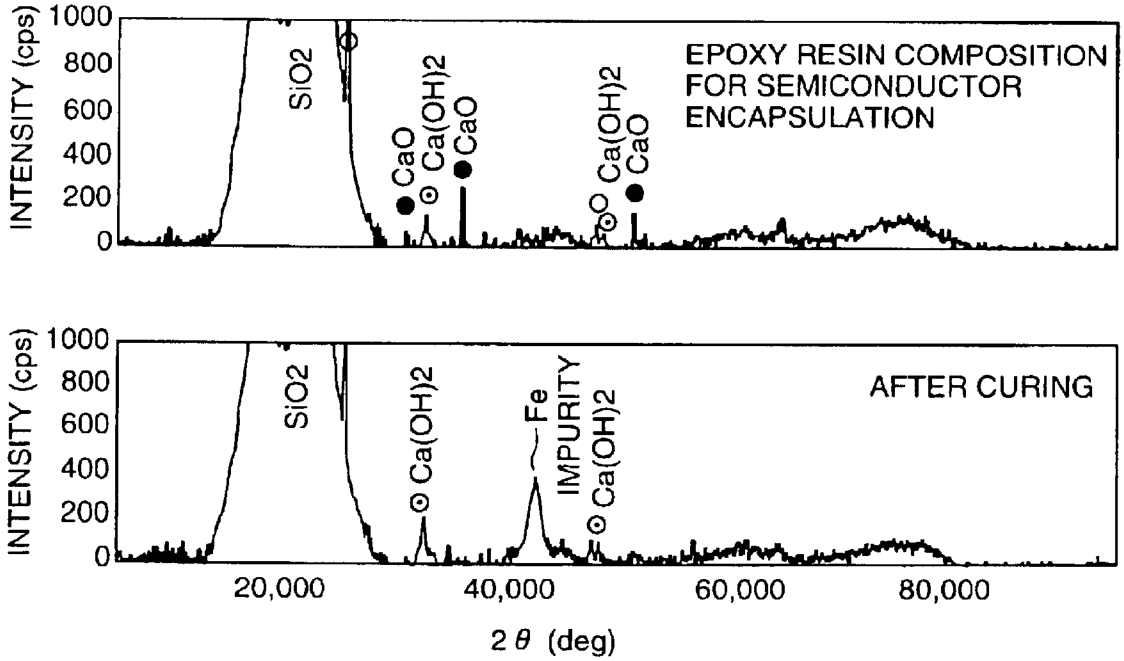
FIG. 2 is a chart showing, for comparison, X-ray diffraction intensities prior to and after curing of an epoxy resin composition of the invention.

FIG. 2 shows an X-ray diffraction intensity of the epoxy resin composition for semiconductor encapsulation of Example 1 of the invention and its cured product. With the epoxy resin composition prior to curing, calcium oxide and a slight amount of calcium hydroxide are detected. It is understood that this calcium hydroxide is changed from calcium oxide upon mixing of materials. Upon review of the X-ray diffraction intensity after curing, the intensity for calcium oxide lowers as the intensity of calcium hydroxide becomes greater. From the above, the effect of calcium oxide is believed to effectively absorb moisture upon curing of the epoxy resin composition and promote the curing reaction so as to change to a more stable compound after curing and exists in the epoxy resin composition.

The invention is more particularly described by way of the following examples.

EXAMPLES 1_6 AND COMPARATIVE EXAMPLES 1_5

Table 1 shows starting materials of epoxy resin compositions for semiconductor encapsulation of the invention. Table 2 shows formulation ratios of starting materials in examples of epoxy resin compositions for semiconductor encapsulation of the invention and also characteristic properties. Table 3 shows formulation ratios of starting materials in comparative examples of epoxy resin compositions for semiconductor encapsulation of the invention and characteristic properties.

TABLE 1

| | Starting Materials Used | Symbol |
|---|---|---|
| Epoxy resin | 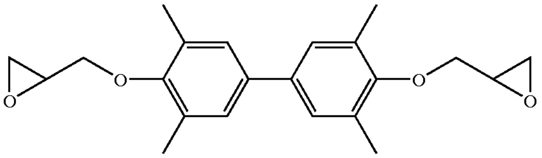 epoxy equivalent: 195 eq/g biphenyl-type epoxy resin | A |
| | 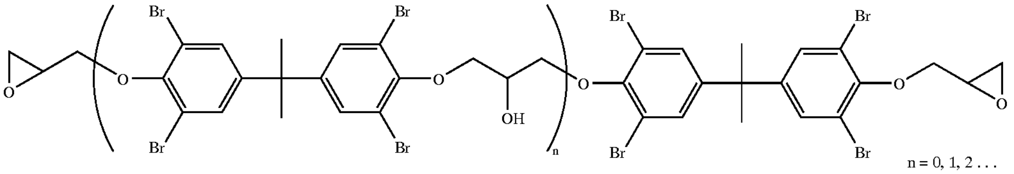 n = 0, 1, 2 . . . epoxy equivalent: 375 eq/g brominated epoxy resin | B |
| Curing agent | 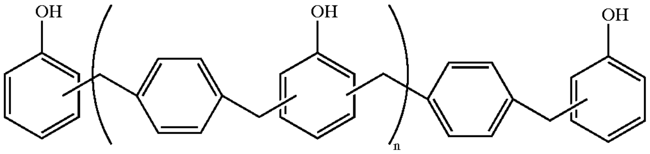 Hydroxyl equivalent: 172 eq/g | C |
| Curing catalyst | Triphenyl phosphine | |

[Formula 1]

formula (1)

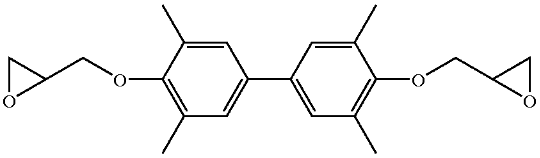

TABLE 2

| Starting materials | | Example 1 wt % phr | Example 1 wt % | Example 2 wt % phr | Example 2 wt % | Example 3 wt % phr | Example 3 wt % | Example 4 wt % phr | Example 4 wt % | Example 5 wt % phr | Example 5 wt % | Example 6 wt % phr | Example 6 wt % |
|---|---|---|---|---|---|---|---|---|---|---|---|---|---|
| Epoxy resin | A | 90 | 5.20 | 90 | 5.20 | 90 | 5.20 | 92 | 5.45 | 100 | 4.75 | 100 | 4.75 |
| Brominated epoxy resin | B | 10 | 0.58 | 10 | 0.58 | 10 | 0.58 | 8 | 0.47 | 0 | 0.00 | 0 | 0.00 |
| Curing agent | C | 83.5 | 4.82 | 83.5 | 4.82 | 83.5 | 4.82 | 84.3 | 5.00 | 131.6 | 6.28 | 131.6 | 6.24 |
| Curing promoter | D | 1.60 | 0.09 | 1.50 | 0.09 | 1.50 | 0.09 | 1.50 | 0.09 | 1.50 | 0.07 | 1.50 | 0.07 |
| Flame retardand aid | Antimony oxide | 6 | 0.35 | 6 | 0.35 | 6 | 0.35 | 0 | 0.00 | 0 | 0.00 | 0 | 0.00 |
| Colorant | Carbon black | 1 | 0.06 | 1 | 0.06 | 1 | 0.06 | 1 | 0.06 | 1 | 0.05 | 1 | 0.05 |

TABLE 2-continued

| Starting materials | | Example 1<br>wt %<br>phr | <br><br>wt % | Example 2<br>wt %<br>phr | <br><br>wt % | Example 3<br>wt %<br>phr | <br><br>wt % | Example 4<br>wt %<br>phr | <br><br>wt % | Example 5<br>wt %<br>phr | <br><br>wt % | Example 6<br>wt %<br>phr | <br><br>wt % |
|---|---|---|---|---|---|---|---|---|---|---|---|---|---|
| Coupling agent | γ-glycidoxy-propyltri-ethoxysilane | 3 | 0.17 | 3 | 0.17 | 3 | 0.17 | 3 | 0.18 | 3 | 0.14 | 3 | 0.14 |
| Release agent | Montanic ester | 1 | 0.08 | 1 | 0.08 | 1 | 0.08 | 1 | 0.08 | 1 | 0.05 | 1 | 0.05 |
| Fused silica | | 1526.4 | 88.11 | 1526.4 | 88.11 | 1526.4 | 88.11 | 1485.9 | 88.10 | 1854.2 | 88.20 | 1854.2 | 87.99 |
| Alkaline earth metal oxide | | Calcium oxide | | Magnes-ium oxide | | Barium oxide | | Calcium oxide | | Calcium oxide | | Calcium oxide | |
| | | 10 | 0.58 | 10 | 0.58 | 10 | 0.58 | 10 | 0.59 | 10 | 0.48 | 10 | 0.47 |
| Inorganic flame retardant | | — | | — | | — | | — | | — | | Calcium meta-boroate | |
| | | 0.00 | 0.00 | 0.00 | 0.00 | 0.00 | 0.00 | 0.00 | 0.00 | 0.00 | 0.00 | 5.00 | 0.24 |
| Total | | 1732.4<br>0 | 100<br>.00 | 1732.4<br>0 | 100<br>.00 | 1732.4<br>0 | 100<br>0 | 1686.7<br>.00 | 100<br>0 | 2102.3<br>.00 | 100<br>0 | 2107.3<br>.00 | 100 |
| Formulation ratio of calcium oxide and curing agent | Wt % | 12.0 | | 12.0 | | 12.0 | | 11.9 | | 7.6 | | 7.6 | |
| Spiral flow (inch) | Prior to storage | 38 | | 37 | | 36 | | 36 | | 40 | | 39 | |
| Barcol hardness immediately after molding | Prior to storage | 85 | | 85 | | 85 | | 85 | | 82 | | 81 | |
| Spiral flow (inch) | After storage under 25° C. for 72 hours | 32 | | 30 | | 31 | | 32 | | 38 | | 37 | |
| Barcol hardness immediately after molding | After storage under 25° C. for 72 hours | 61 | | 76 | | 80 | | 82 | | 78 | | 78 | |
| Glass transition temperature | (° C.) | 125 | | 125 | | 125 | | 125 | | 120 | | 120 | |
| UL94 combustion test | Total combustion time (s) | 1 | V-0 | 2 | V-0 | 1 | V-0 | 3 | V-0 | 20 | V-0 | 5 | V-0 |

phr: parts by weight

TABLE 3

| Starting materials | | Comp. Ex. 1<br>wt %<br>phr | <br><br>wt % | Comp. Ex. 2<br>wt %<br>phr | <br><br>wt % | Comp. Ex. 3<br>wt %<br>phr | <br><br>wt % | Comp. Ex. 4<br>wt %<br>phr | <br><br>wt % | Comp. Ex. 5<br>wt %<br>phr | <br><br>wt % |
|---|---|---|---|---|---|---|---|---|---|---|---|
| Epoxy resin | A | 90.0 | 5.22 | 90.0 | 5.22 | 90.0 | 5.22 | 92 | 5.49 | 100.0 | 4.78 |
| Brominated epoxy resin | B | 10.0 | 0.58 | 10.0 | 0.58 | 10.0 | 0.58 | 8 | 0.48 | 0.0 | 0.00 |
| Curing agent | C | 83.5 | 4.85 | 83.5 | 4.85 | 83.5 | 4.85 | 84.3 | 5.03 | 131.6 | 6.29 |
| Curing promoter | D | 1.8 | 0.10 | 1.8 | 0.10 | 1.8 | 0.10 | 1.8 | 0.11 | 1.8 | 0.09 |
| Flame retardand aid | Antimony oxide | 6.0 | 0.35 | 6.0 | 0.35 | 6.0 | 0.35 | 0 | 0.00 | 0.0 | 0.00 |
| Colorant | Carbon black | 1.0 | 0.06 | 1.0 | 0.06 | 1.0 | 0.06 | 1 | 0.06 | 1.0 | 0.05 |
| Coupling Agent | γ-glycidoxypropyl triethoxysilane | 3.0 | 0.17 | 3.0 | 0.17 | 3.0 | 0.17 | 3 | 0.18 | 3.0 | 0.14 |
| Release agent | Montanic ester | 1.0 | 0.06 | 1.0 | 0.06 | 1.0 | 0.06 | 1 | 0.06 | 1.0 | 0.05 |
| Fused silica | | 1526.4 | 88.61 | 1526.4 | 88.59 | 1526.4 | 88.61 | 1485.9 | 88.60 | 1854.2 | 88.61 |
| Alkaline earth metal oxide | | nil | | calcium oxide | | calcium oxide | | nil | | nil | |
| | | 0.0 | 0.00 | 0.3 | 0.02 | 50.0 | 2.90 | 0 | 0.00 | 0.0 | 0.00 |
| Inorganic flame retardant | | — | | — | | — | | — | | — | |
| | | 0.0 | 0.00 | 0.0 | 0.00 | 0.0 | 0.00 | 0.0 | 0.00 | 0.0 | 0.00 |
| Total | | 1722.7 | 100.00 | 1723.0 | 100.00 | 1772.7 | 102.90 | 1677.00 | 100.00 | 2092.6 | 100.00 |

TABLE 3-continued

| Starting materials | | Comp. Ex. 1 wt % phr | Comp. Ex. 1 wt % | Comp. Ex. 2 wt % phr | Comp. Ex. 2 wt % | Comp. Ex. 3 wt % phr | Comp. Ex. 3 wt % | Comp. Ex. 4 wt % phr | Comp. Ex. 4 wt % | Comp. Ex. 5 wt % phr | Comp. Ex. 5 wt % |
|---|---|---|---|---|---|---|---|---|---|---|---|
| Formulation ratio of calcium oxide and curing agent | Wt % | 0.0 | | 0.4 | | 59.9 | | 0.0 | | 0.0 | |
| Spiral flow (inch) | Prior to storage | 39 | | 39 | | 20 | | 39 | | 43 | |
| Barcol hardness immediately after molding | Prior to storage | 82 | | 83 | | 85 | | 82 | | 10 | |
| Spiral flow (inch) | After storage under 25° C., relative humidity of 20% or below for 72 hours | 25 | | 26 | | 18 | | 25 | | 33 | |
| Barcol hardness immediately after molding | After storage under 25° C., relative humidity of 50% for 72 hours | 30 | | 45 | | 83 | | 30 | | 0 | |
| Glass transition temperature | (° C.) | 120 | | 122 | | 125 | | 120 | | Impossible to mold | |
| UL94 combustion test | Total combustion time (a) | 1 | V-0 | 2 | V-0 | 1 | V-0 | 124 | V-1 | — | — |

phr: parts by weight

The starting materials indicated in Table 1, fused silica having an average particle size of 10 μm, carbon black used as a colorant, γ-glicydoxypropyltriethoxysilane serving as a coupling agent, montanic ester serving as a release agent and calcium metaborate used as a flame retardant and having an average particle size of 3–10 μm were used to provide epoxy resin compositions of examples and comparative examples indicated in Tables 2 and 3, respectively.

Different types of the formulated starting materials were each mixed using a two-roll mixing mill heated to 65° C. and 90° C. for about 15 minutes. Thereafter, the resultant mixture was pulverized by a pulverizer, followed by molding into tablets with a given size by use of a tablet molding machine to obtain an epoxy resin composition for semiconductor encapsulation.

Fluidity was determined according to SPI-EMMI1-66 wherein a spiral molding was obtained under conditions of 180° C. and 90 seconds to determine a flow length and a flow length of 25 inches or over was deemed acceptable. Curability was determined by measuring a surface hardness of molding immediately after removal of a spiral test piece from a mold with the Barcol hardness tester (No. 935) wherein a hardness of 75 or over was accepted as good.

A glass transition temperature of the cured product of the epoxy resin composition was determined using a cylindrical sample which had been transfer molded under conditions of 180° C. and 90 seconds and further cured at 180° C. for 6 hours. The sample was heated at a rate of 5° C./minute by use of a thermal physical tester to determine an inflection point in linear expansion of the sample as the glass transition temperature.

Figure 3:
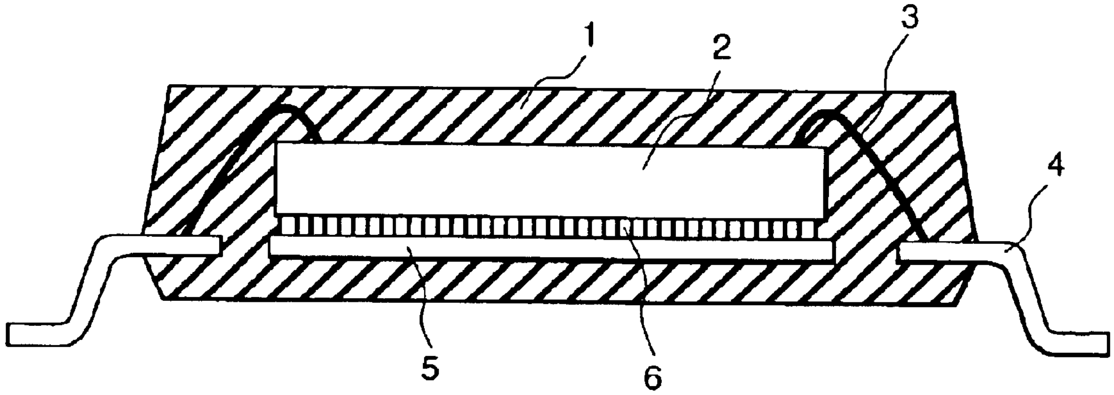
FIG. 3 is a sectional view of a semiconductor device encapsulated with an epoxy resin composition of the invention.

FIG. 3 is a sectional view of a semiconductor device encapsulated with the epoxy resin composition for semiconductor encapsulation of the invention. For the manufacture of the semiconductor device shown in FIG. 3, a semiconductor element 2 was fixedly bonded to a die pad 5 of a copper lead frame through a bonding layer 6 such as a silver paste. Thereafter, an aluminium pad portion on the semiconductor element 2 and a partially silver-metallized outer lead 4 of the copper lead frame were connected via wire bonding with a gold wire 3. The resultant device was subjected to low pressure transfer molding using an epoxy resin composition 1 of the invention under conditions of 180° C. and 90 seconds at a molding pressure of 70 $KG/CM^2$. Subsequently, after-curing was carried out at 180° C. for 6 hours, followed by subjecting the lead frame to tiebar cutting, solder plating of the outer lead 4 and bending to obtain the semiconductor device shown in FIG. 3.

Figure 4:
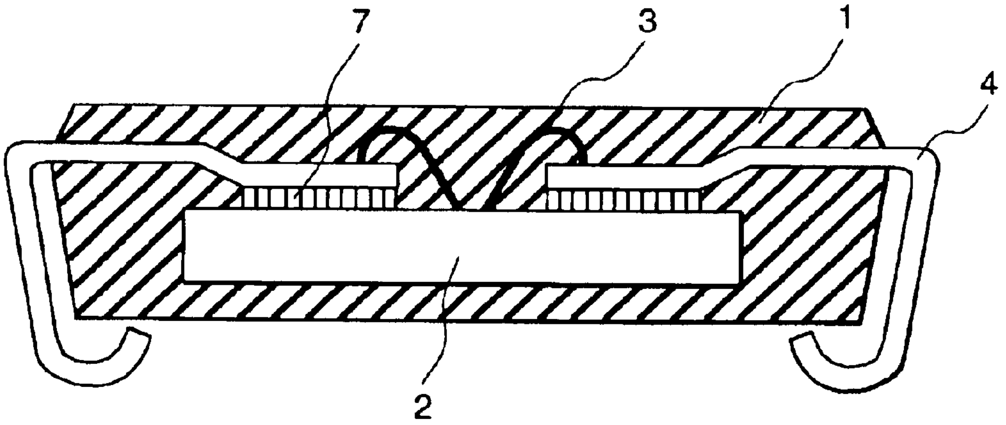
FIG. 4 is a sectional view of another type of semiconductor device encapsulated with an epoxy resin composition of the invention.

FIG. 4 is a sectional view of another type of semiconductor device encapsulated with an epoxy resin composition of the invention. For the fabrication of the semiconductor device shown in FIG. 4, a semiconductor element and a copper lead frame having an outer lead 4 were bonded and fixed through a bonding layer 7 such as a polyimide double-coated adhesive. Thereafter, an aluminium pad portion on the semiconductor element 2 and the outer lead 4 of the partially silver-plated copper lead frame were wire-bonded with a gold wire 3. These members were subjected to a low pressure transfer molding with an epoxy resin composition 1 for semiconductor encapsulation of the invention under conditions of 180° C. and 90 seconds at a molding pressure of 70 $KG/CM^2$. Subsequently, after after-curing at 180° C. for 6 hours, the tiebar of the lead flame was cut off and the outer lead 4 was subjected to solder plating and bent to obtain the semiconductor device shown in FIG. 4.

Figure 5:
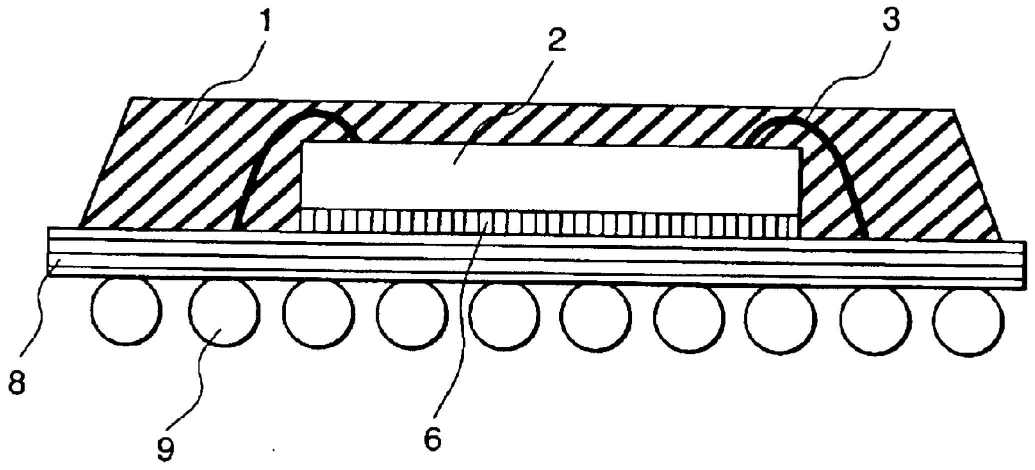
FIG. 5 is a sectional view of a further type of semiconductor device encapsulated with an epoxy resin composition of the invention.

FIG. 5 is a sectional view of further type of semiconductor device encapsulated with an epoxy resin composition of the invention. For the fabrication of the semiconductor device shown in FIG. 5, a semiconductor element 2 was fixedly bonded to an organic printed circuit board 8 having a four-layered wiring layer through a bonding layer 6 such as a silver paste. An aluminium pad portion of the semiconductor element 2 and a pad portion of the printed board were subjected to wire bonding with a gold wire 3. The semiconductor-mounting surface of these members was subjected to low pressure transfer molding with an epoxy resin composition 1 for semiconductor encapsulation of the invention under conditions of 180° C. and 90 seconds at a molding pressure of 70 $KG/CM^2$. Subsequent to after-curing at 180° C. for 6 hours, solder balls 9 were attached to, thereby obtaining the semiconductor device shown in FIG. 5.

Figure 6:
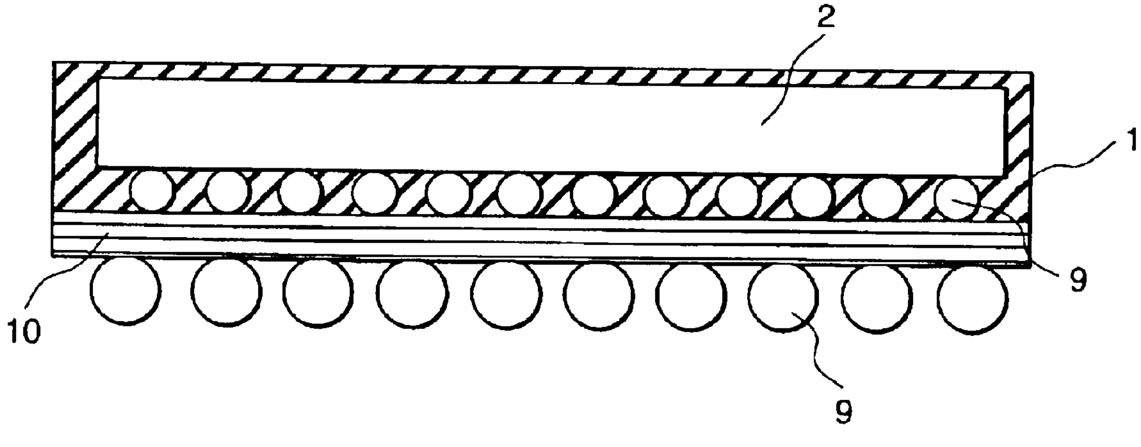
FIG. 6 is a sectional view of a still further type of semiconductor device encapsulated with an epoxy resin composition of the invention.

FIG. 6 is a sectional view of a still further type of semiconductor device encapsulated with an epoxy resin composition of the invention. For the fabrication of the semiconductor device shown in FIG. 6, solder balls 9 were formed at the pad portion of the semiconductor element 2. Thereafter, the solder balls 9 on the semiconductor element 2 and the pad portion of an alumina ceramic printed circuit board 10 were connected and fixedly banded through melting of the solders. The semiconductor-mounting surface of these members was subjected to low pressure transfer molding with an epoxy resin composition 1 for semiconductor encapsulation of the invention under conditions of 180° C. and 90 seconds at a molding pressure of 70 $KG/CM^2$. Subsequent to after-curing at 180° C. for 6 hours, solder balls 9 were attached to, thereby obtaining the semiconductor device shown in FIG. 6.

EXAMPLES 7~15 AND COMPARATIVE EXAMPLES 7~14

In Example 7, a reliability test was conducted by use of Example 1 of the invention to make a semiconductor device of the type shown in FIG. 3 in a usual way. Table 4 shows high-temperature standing reliability and moistureproof reliability of semiconductive devices of the examples and comparative examples.

TABLE 4

| Example | Example 7 | Example 8 | Example 9 | Example 10 | Example 11 | Example 12 | Example 13 | Example 14 | Example 15 |
|---|---|---|---|---|---|---|---|---|---|
| Epoxy resin composition for semiconductor encapsulation | Example 1 | Example 2 | Example 3 | Example 4 | Example 5 | Example 6 | Example 1 | Example 1 | Example 1 |
| Fabricated semiconductor device | FIG. 3 | FIG. 3 | FIG. 3 | FIG. 3 | FIG. 3 | FIG. 3 | FIG. 4 | FIG. 5 | FIG. 6 |
| Molding Cycle (seconds) | 50 | 50 | 50 | 50 | 65 | 65 | 50 | 50 | 50 |
| Calcium oxide contained in encapsulation layer (X-ray analysis) | Detectable | Detectable | Detectable | Detectable | Detectable | Detectable | Detectable | Detectable | Detectable |
| High-temperature Standing Reliability (hours) | 670 | 600 | 650 | 750 | 850 | 800 | 700 | 650 | 400 |
| Moisture-proofness (hours) | 1000 | 900 | 800 | 1200 | 1500 | 1300 | 1000 | 900 | 600 |

| Comp. Ex. | Comp. Ex. 7 | Comp. Ex. 8 | Comp. Ex. 9 | Comp. Ex. 10 | Comp. Ex. 11 | Comp. Ex. 12 | Comp. Ex. 13 | Comp. Ex. 14 |
|---|---|---|---|---|---|---|---|---|
| Epoxy resin composition for semiconductor encapsulation | Comp. Ex. 1 | Comp. Ex. 2 | Comp. Ex. 3 | Comp. Ex. 4 | Comp. Ex. 5 | Comp. Ex. 1 | Comp. Ex. 1 | Comp. Ex. 1 |
| Fabricated semiconductor device | FIG. 3 | FIG. 3 | FIG. 3 | FIG. 3 | FIG. 3 | FIG. 4 | FIG. 5 | FIG. 6 |
| Molding Cycle (seconds) | 65 | 65 | 50 | 65 | Not molded | 65 | 65 | 65 |
| Calcium oxide contained in encapsulation layer (X-ray analysis) | Not detected | Not detected | Not detected | Not detected | Not detected | Not detected | Not detected | Not detected |
| High-temperature Standing reliability (hours) | 500 | 500 | 500 | 550 | — | 550 | 450 | 200 |
| Moisture-proofness hours | 800 | 800 | 700 | 850 | — | 800 | 750 | 450 |

Likewise, Examples 8, 9, 10, 11, 12, 13, 14, 15 and Comparative Examples 7, 8, 9, 10, 11, 12, 13, 14 were carried out using combinations of the epoxy resin compositions for semiconductor encapsulation and the semiconductor devices indicated in Table 4 to conduct a molding cycle test, a high-temperature standing reliability test and a moistureproof reliability test.

The molding cycle test of the examples and comparative examples were effected such that a mass-producible molding time was measured using a transfer molding machine. After molding of an epoxy resin composition for semiconductor encapsulation, the resultant encapsulation layer was checked with respect to cracking, deformation, a gate portion left in a mold, a hardness of a cull and the like.

The high-temperature standing reliability test of the semiconductor devices of the examples and comparative examples was effected such that 50 semiconductor devices of individual examples and comparative examples were placed under storage conditions of 200° C. and subjected to an electric conduction test every hour to record the number of semiconductor devices failed in the conduction. The storage time at which the number of defectives arrived at 50% of 50 devices is shown in the table.

The moistureproof reliability test of the examples and comparative examples was effected such that semiconductor devices were placed under pressure cooker test conditions (121° C., 2 atms, relative humidity of 100%) and subjected to an electric conduction test every hour to record the number of semiconductor devices failed in the conduction. The time at which the number of defectives arrived at 50% of the placed 50 devices is shown in the table.

In Tables 2 and 3, there are shown moldability and a glass transition temperature, which is an index of heat resistance, of the epoxy resin compositions for semiconductor encapsulation of Examples 1 to 6 and Comparative Examples 1 to 5.

The comparison between Example 1 and Comparative Example 1 reveals that with the epoxy resin composition formulated with calcium oxide as in the invention, curability is improved so that a hardness at 180° C. after molding increases to 85 in Example 1 relative to 82 in Comparative Example 1. The glass transition temperature indicating a heat resistance of a cured product is at 125° C. in Example 1, which is improved over 120° C. in Comparative Example 1. The comparison of the hardnesses under heating conditions after storage at 25° C. at a relative humidity of 50% for 72 hours reveals that the hardness is at 81 in Example 1 with a reduction of 4.7% and is at 30 in Comparative Example 1 with reduction of 63%. From this, it will be appreciated that the addition of calcium oxide contributes to reducing the lowering of the hardness when moisture is absorbed. The comparison of the spiral flow values demonstrates that after storage for 72 hours under drying conditions of 25° C. and a relative humidity of 20% or below, the value is at 32 inches in Example 1 with a reduction of 15.8%, and is at 25 inches in Comparative example 1 with a reduction of 35.9%. This is considered for the reason that in Comparative Example 1, triphenyl phosphine serving as a curing promoter is increased over the example, so that the curing reaction gradually proceeds at room temperature.

It will be seen that Comparative Example 2 wherein the adding amount of calcium oxide is changed to 0.4% relative to the curing agent exhibits a smaller effect of improving curability than Example 1. With Comparative Example 3 wherein calcium oxide is added in an amount of 59.9% of the curing agent, curability and the glass transition temperature are satisfactorily improved in comparison with those of Example 1. However, fluidity lowers owing to the addition of calcium oxide, so that the spiral flow value lowers to 20 inches.

It has been confirmed that Examples 2, 3 wherein the added alkaline earth metal oxide is changed to magnesium oxide and barium oxide, respectively, are improved in moldabiity and increase in glass transition temperature in comparison with Comparative Example 1.

The comparison between Example 4 wherein the amounts of the brominated epoxy resin serving as a flame retardant and antimony oxide are reduced and Comparative Example 4 reveals that the combustion test of UL94 standards is such that a total combustion time is at 3 seconds, and is judged as V-0 in Example 4, whereas in Comparative Example 4 where no calcium oxide is formulated, a total combustion time of the UL94 combustion test is at 124 seconds, thus judged as V-1.

The comparison between Example 5 and Comparative Example 5 wherein neither brominated epoxy resin serving as a flame retardant nor antimony oxide was formulated and a ratio by equivalent of the phenolic resin curing agent to the epoxy resin was made 1.5 times greater reveals that in Comparative Example 5, curability lowers extremely and the Barcol hardness prior to storage was at 10, thus making it impossible to mold a test piece for measurement of a glass transition temperature and a test piece for the UL94 combustion test. In contrast, in Example 5, satisfactory curability was obtained and the test pieces could be molded. In the UL94 combustion test, the total combustion time was at 20 seconds with a judgement as V-0.

In Example 6 where calcium metaborate was further added to the composition of Example 5, the effects of improving curability after absorption of moisture and the glass transition temperature over those of Comparative Example 5 were obtained. The total combustion time in the UL94 combustion test was at 5 seconds relative to 20 seconds of Example 5, and thus, the flame retardancy level was found to be further improved.

Table 4 shows the results of Examples 7~15 and Comparative Examples 7~14. The comparisons between Examples 7, 8, 9, 10, 11, 12 and Comparative Examples 7, 8, 9, 10, 11 reveal that both high temperature standing reliability and moistureproof reliability are improved. The molding cycle time ensuring mass production is made shorter in the example, from which it was confirmed that mass productivity was improved. Examples 10, 11, 12 wherein the brominated epoxy resin and antimony oxide were reduced in amounts or were not contained were improved over other Examples 7~9 with respect to the high temperature standing reliability and moistureproof reliability.

As will be seen from the foregoing, the epoxy resin composition for semiconductor encapsulation of the invention has good curability and heat resistance. The semiconductor device of the invention has good reliability in heat resistance and moistureproofing.

According to the invention, there can be achieved an epoxy resin composition for semiconductor encapsulation which is unlikely to absorb moisture when stored and impede curing when molded and also a semiconductor device using the composition.

There can also be achieved an epoxy resin composition for semiconductor encapsulation which does not permit mass productivity to be lowered and the heat resistance of a molding obtained after curing to lower, and a semiconductor device using the same.

Further, there can be achieved an epoxy resin composition for semiconductor encapsulation which has good curability when molded, is able to provide a cured product having a high heat resistance and has high flame retardancy and also a highly reliable semiconductor device using the same.

In addition, there can be achieved an epoxy resin composition for semiconductor encapsulation having excellent curability, moldability and mass productivity and a semiconductor device encapsulated with the composition and thus having excellent long-term reliability.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. An epoxy resin composition comprising:

a biphenyl based epoxy resin;

a curing agent; and an inorganic filler containing an alkaline earth metal oxide;

wherein said inorganic filler contains calcium oxide.

2. The epoxy resin composition of claim wherein said calcium oxide is formulated in an amount of from 0.5 wt % to 50 wt % relative to said curing agent.

3. The epoxy resin composition of claim 1 wherein said inorganic filler contains at least 78 vol % silica and further contains calcium metaborate.

4. An epoxy resin composition comprising a biphenyl based epoxy resin, a phenolic curing agent) and an inorganic filler containing calcium oxide;

wherein said epoxy resin composition exhibits a less than 10% variation rate of hardness at 25° C. and a relative humidity of 50% for 72 hours, and a less than 20% variation rate of flow at 25° C. and a relative humidity of 20% or below for 72 hours.

5. The epoxy resin composition of claim 4 wherein a ratio of hydroxyl groups of said phenolic curing agent and epoxy groups of said biphenyl based epoxy resin is about 1.3 to 1.5.

6. An epoxy resin composition comprising:

a biphenyl based epoxy resin;

a curing agent; and an inorganic filler containing at least 78 vol % silica and further containing calcium metaborate and an alkaline earth metal oxide.

7. An epoxy resin composition comprising:

a biphenyl based epoxy resin;

a curing agent; and an inorganic filler containing an alkaline earth metal oxide, said inorganic filler further comprising at least 78 vol % silica and calcium metaborate;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

8. An epoxy resin composition comprising:

a biphenyl based epoxy resin; and an inorganic filler comprising calcium oxide;

wherein said epoxy resin composition has a variation rate of hardness at 25° and a relative humidity of 50% for 72 hours of less than 10% and a variation rare of flow at 25° C. and a relative humidity of 20% or below fix 72 hours of less than 20%.

9. The epoxy resin composition of claim 8, wherein said epoxy resin composition further comprises a curing agent, and said calcium oxide is provided in an amount of from 0.5 wt % to 50 wt % relative to said curing agent.

10. An epoxy resin composition comprising:

a biphenyl based epoxy resin; and an inorganic filler containing an alkaline earth metal oxide, said inorganic filler further comprising at least 78 vol % silica and calcium metaborate;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

11. An epoxy resin composition comprising:

a biphenyl based epoxy resin;

a curing agent; and an inorganic filler containing an alkaline earth metal oxide, said inorganic filler further comprising calcium oxide;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

12. The epoxy resin composition of claim 11, wherein said calcium oxide is formulated in an amount of from 0.5 wt % to 50 wt % relative to said curing agent.

13. The epoxy resin composition of claim 11, wherein said curing agent is a phenolic resin.

14. The epoxy resin composition of claim 13, wherein a ratio of hydroxyl groups of said phenolic resin and epoxy groups of said biphenyl based epoxy resin is about 1.3 to 1.5.

15. An epoxy resin composition comprising:

a biphenyl based epoxy resin;

a curing agent comprising a phenolic resin; and an inorganic filler containing an alkaline earth metal oxide, said inorganic filler further comprising at least 78 vol % silica and calcium metaborate;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

16. The epoxy resin composition of claim 15, wherein a ratio of hydroxyl groups of said phenolic resin and epoxy groups of said biphenyl based epoxy resin is about 1.3 to 1.5.

17. A semiconductor device encapsulated with an epoxy resin said epoxy resin having a composition comprising:

a biphenyl based epoxy resin;

a curing agent; and an inorganic filler containing an alkaline earth metal oxide;

wherein said inorganic filler contains calcium oxide.

18. The device of claim 17 wherein said calcium oxide is formulated in an amount of from 0.5 wt % to 50 wt % relative to said curing agent.

19. The device of claim 17 wherein said inorganic filler contains at least 78 vol % silica and further contains calcium metaborate.

20. A semiconductor device encapsulated with an epoxy resin composition, said epoxy resin composition comprising a biphenyl based epoxy resin, a phenolic curing agent, and an inorganic filler containing calcium oxide;

wherein said epoxy resin composition exhibits a less than 10% variation rate of hardness at 25° C. and a relative humidity of 50% for 72 hours, and a less than 20% variation rate of flow at 25° C. and a relative humidity of 20% or below for 72 hours.

21. The semiconductor device of claim 20 wherein a ratio of hydroxyl groups of said phenolic curing agent and epoxy groups of said biphenyl based epoxy resin is about 1.3 to 1.5.

22. The semiconductor device of claim 20 wherein said calcium oxide is formulated in an amount of from 0.5 wt % to 50 wt % relative to a curing agent.

23. The semiconductor device of claim 22 wherein a ratio of hydroxyl groups of said phenolic resin and epoxy groups of said biphenyl based epoxy resin is about 1.3 to 1.5.

24. A semiconductor device encapsulated with an epoxy resin said epoxy resin having a composition comprising:

a biphenyl based epoxy resin;

a curing agent; and an inorganic filler containing at least 78 vol % silica and further containing calcium metaborate and an alkaline earth metal oxide.

25. A semiconductor device encapsulated with an epoxy resin said epoxy resin having a composition comprising:

a biphenyl based epoxy resin;

a curing agent; and an inorganic filler containing an alkaline earth metal oxide, said inorganic filler further comprising at least 78 vol % silica and calcium metaborate;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

26. A semiconductor device encapsulated with an epoxy resin said epoxy resin having a composition comprising:

an inorganic filler comprising calcium oxide; and a biphenyl based epoxy resin;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

27. The device of claim 26 wherein said epoxy resin composition further comprises a curing agent and said calcium oxide is provided in an amount of from 0.5 wt % to 50 wt % relative to said curing agent.

28. A semiconductor device encapsulated with an epoxy resin said epoxy resin having a composition comprising:

an inorganic filler containing an alkaline earth metal oxide, said inorganic filler further comprising at least 78 vol % silica and calcium metaborate; and a biphenyl based epoxy resin;

wherein said epoxy resin composition has a variation rare of hardness at 25° C. and a relative humidity of 50% for 72 hours of less than 10% and a variation rare of flow at 25° C. and a relative humidity of 20% or below for 72 hours of less than 20%.

29. A semiconductor device encapsulated with an epoxy resin said epoxy resin having a composition comprising:

a biphenyl based epoxy resin;

a curing agent; and an inorganic filler containing calcium oxide;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

30. The device of claim 29, wherein said calcium oxide is formulated in an amount of from 0.5 wt % to 50 wt % relative to said curing agent.

31. A method of fabricating an epoxy resin composition comprising the steps of:

providing a biphenyl based epoxy resin;

filling said biphenyl based epoxy resin with an inorganic filler containing an alkaline earth metal oxide; and curing said biphenyl based epoxy resin with a curing agent;

wherein said inorganic filler contains calcium oxide.

32. The method of claim 31 wherein said calcium oxide is formulated in an amount of from 0.5 wt % to 50 wt % relative to said curing agent.

33. The method of claim 31 wherein said inorganic filler contains at least 78 vol % silica and further contains calcium metaborate.

34. A method of fabricating an epoxy resin composition comprising the steps of:

providing a biphenyl based epoxy resin;

filling said biphenyl based epoxy resin with an inorganic filler containing at least 78 vol % silica and further containing calcium metaborate and an alkaline earth metal oxide; and curing said filled biphenyl based epoxy resin with a curing agent.

35. A method of fabricating an epoxy resin composition comprising the steps of:

providing a biphenyl based epoxy resin; and filling said biphenyl based epoxy resin with an inorganic filler containing calcium oxide;

wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

36. A method of fabricating an epoxy resin composition comprising the steps of:

providing a biphenyl based epoxy resin;

filling said biphenyl based epoxy resin with an inorganic filler containing an alkaline earth metal oxide, said inorganic filler further comprising at least 78 vol % silica and calcium metaborate; and wherein said epoxy resin composition has a variation rare of hardness at 25° C. and a relative humidity of 50% for 72 hours of less than 10% and a variation rate of flow at 25° C. and a relative humidity of 20% or below for 72 hours of less than 20%.

37. A method of fabricating an epoxy resin composition comprising the steps of:

providing a biphenyl based epoxy resin filling said biphenyl based epoxy resin with an inorganic filler containing calcium oxide; and curing said filled biphenyl based epoxy resin with a curing agent;

wherein said epoxy resin combination has a variation rate of hardness at 25° C. and a relative humidity of 50% for 72 hours of less than 10% and a variation rate of flow at 25° C. and a relative humidity of 20% or below for 72 hours of less than 20%.

38. The method of claim 37 wherein said calcium oxide is formulated in an amount of from 0.5 wt % to 50 wt % relative to said curing agent.

39. The method of claim 37 wherein said curing agent is a phenolic resin.

40. The method of claim 39 wherein a ratio of hydroxyl groups of said phenolic resin and epoxy groups of said biphenyl based epoxy resin is about 1.3 to 1.5.

41. The method of claim 37 wherein said inorganic filler contains at least 78 vol % silica and further contains calcium metaborate.

42. A method of fabricating an epoxy resin composition comprising the steps of:

providing a biphenyl based epoxy resin;

filling said biphenyl based epoxy resin with an inorganic filler containing an alkaline earth metal oxide, said inorganic filler further comprising calcium oxide;

curing the filled biphenyl based epoxy resin with a curing agent; and wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

43. The method of claim 42, wherein said calcium oxide is formulated in an amount of from 0.5 wt % to 50 wt % relative to said curing agent.

44. The method of claim 42, wherein said curing agent is a phenolic resin.

45. The method of claim 44 wherein a ratio of hydroxyl groups of said phenolic resin and epoxy groups of said biphenyl based epoxy resin is about 1.3 to 1.5.

46. A method of fabricating an epoxy resin composition comprising the steps of:

providing a biphenyl based epoxy resin;

filling said biphenyl based epoxy resin with an inorganic filler containing an alkaline earth metal oxide, said inorganic filler further comprising at least 78 vol % silica and calcium metaborate;

curing the filled biphenyl based epoxy resin with a curing agent; and wherein said epoxy resin composition has a variation rate of hardness at 25° C. and a relative humidity of 50% for 72 hours of less than 10% and a variation rate of flow at 25° C. and a relative humidity of 20% or below for 72 hours of less than 20%.

* * * * *